Jan. 29, 1963 J. H. McCONVILLE 3,075,282

SEMICONDUCTOR DEVICE CONTACT

Filed July 24, 1959

INVENTOR
J. H. McCONVILLE
BY H. W. Lockhart
ATTORNEY

United States Patent Office 3,075,282

Patented Jan. 29, 1963

3,075,282

SEMICONDUCTOR DEVICE CONTACT

Joseph H. McConville, New Providence, N.J., assignor to Bell Telephone Laboratories, Incorporated, New York, N.Y., a corporation of New York Filed July 24, 1959, Ser. No. 829,427
3 Claims. (Cl. 29—155.55)

This invention relates to a process and apparatus for fabricating electrical connections to semiconductive wafers.

In the prior art, the various approaches to the fabrication of electrical connections to semiconductive wafers customarily involve some combination of pressure and temperature. For example, a low pressure is used if a high temperature is used. However, high temperatures tend to have an undesirable effect on the electrical characteristics of the connection and the mechanical strength of the lead wire. Alternatively, a low temperature is used if a high pressure is used. However, this pressure is applied through bonding tools which tend to cause deformation of the contact. Since the electrical characteristics of the contact are dependent on the area of the contact, any uncontrolled deformation will produce undesirable results.

Accordingly, a principal object of this invention is to facilitate the connection of electrical contact or lead wires to semiconductive wafers without heating the wafers or applying significant amounts of pressure.

In the process of the present invention, a contact or lead wire is positioned in a suitably adapted apparatus proximate to, but not in contact with, a preselected point of contact on a semiconductive wafer surface and thereafter propelled at such point of contact by air of gas pressure. Mechanically strong, shallow alloyed contacts are provided in this manner.

Generally, diffused junction devices include surface zones of minute thickness. Contacts to semiconductive wafers including such zones are particularly difficult because such zones often are penetrated in the process. Costly processes typically have been adopted to avoid such penetration. However, the process of this invention has been found particularly well adapted to avoiding such penetration.

Therefore, another object of this invention is a shallow alloyed contact to diffused junction structures.

In practice, the lead wire is positioned in an apparatus, to be described hereinafter, with the tip of the wire protruding beyond the apparatus in the direction of the semiconductive wafer. This protruding tip is then melted into a molten ball and the lead wire is propelled, molten ball, first, toward the surface of the semiconductive wafer.

Therefore, one feature of this invention is the propulsion of a balled lead, balled end first, through a relatively cool space at the surface of a relatively cool semiconducitve wafer.

The process may be practiced with any semiconductive material such as germanium and silicon. However, the surfaces of the semiconductive wafer advantageously should be etched. In particular, it has been found that contacts applied to oxidized semiconductive wafer surfaces usually lack suitable mechanical strength. Therefore, the process advantageously is carried out either in a forming gas atmosphere to prevent oxidation or, alternatively, shortly after the semiconductive wafer has been etched in order to avoid significant oxidation.

The semiconductive wafer is positioned about one quarter to one half an inch from the molten ball described above. This range has been found most suitable in making electrical connections to silicon with a lead wire of about four-thousandths of an inch diameter. Appropriate gas pressure to propel the wire from such distances range typically from twenty to sixty-five pounds per square inch. In particular, the wafer must be close enough to be reached by the molten ball when the latter is ejected from the apparatus and the pressure in turn must be sufficient to propel the lead associated with the molten ball to the wafer but not enough to drive the lead through the molten ball either on ejection or on contact with the semiconductive wafer.

The limitations on the pressure are to prevent physical damage to the semiconductive wafer which would result if the solid lead wire were to penetrate beyond the region of contact between the molten ball and the semiconductive wafer.

Various lead wire materials are suitable for use in this process. Ordinarily, the molten ball on the tip of the lead wire should form a eutectic with the semiconductive material or there will be no resultant bond. Accordingly, it is advantageous that the lead wire material have this property. Alternatively, there may be employed a lead wire material which does not have this property, if a molten ball of a eutectic forming material such as gold may be provided on the tip of the wire. Accordingly, this procedure can be extended for use with various lead materials, such as molybdenum, nickel and copper whether the material forms a eutectic with the semiconductive material or not.

Usually, the ball will have a diameter equal to twice the diameter of the wire. However, this may vary. For example, a wire with a diameter of .004 inch may have a ball with a diameter of .010 inch.

Naturally, the pressure used will depend on the mass of the wire and the distance to be traversed. The mass of the wire depends on the diameter of the wire and its length. Typically, the diameter of the wire will vary from about two to fifteen-thousandths of an inch and the length from about four to five-tenths of an inch.

By regulating the air or gas pressure applied, the distance between the lead and the semiconductive wafer, and the nature of the molten ball, the depth of alloying may be controlled. The electrical characteristics of the contact are determined by the depth of alloying and the geometry of the contact as described above. Therefore, precise control is gained over the electrical characteristics of the contact in this manner.

The electrical nature of the contact, whether ohmic or rectifying, is determined by the conductivity type of the semiconductive wafer and the nature of the molten ball. If, for example, an aluminum ball is connected to N-type germanium, a rectifying contact will result. However, if a gold ball is connected to P-type germanium, a substantially ohmic contact will result. By utilizing a gold ball doped with a significant impurity, a contact of prescribed characteristics can be made. For example, a gold ball containing less than two percent aluminum, in contact with N-type silicon, will produce a rectifying contact.

Further objects and features of the invention will become apparent during the course of the following detailed description which is rendered with reference to the accompanying drawings in which.

Figure 1:
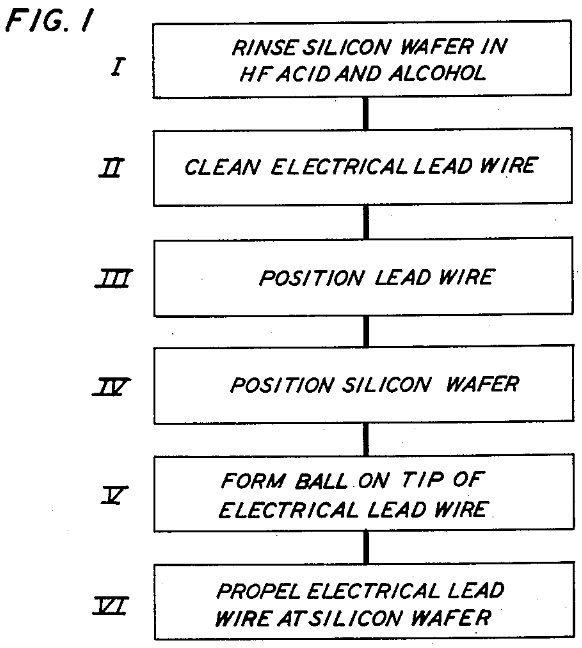
FIG. 1 illustrates in block diagram form the various steps of the method of this invention.

As an example of the fabrication of a semiconductive diode including both a rectifying and a substantially ohmic contact made in accordance with the process of the present invention, a P-type silicon wafer forty by forty by five thousandths of an inch is prepared by rinsing the wafer in an etching solution, for example, one comprising approximately 30 parts hydrofluoric acid to 1 part methyl alcohol by volume, for one minute, then rinsing in methyl alcohol, and blotting dry as indicated in block I of FIG. 1. A gold lead wire four-thousandths of an inch in diameter and three-eighths inches long then is degreased in a solution, typically comprising 1 part concentrated trichlorethylene and 1 part water by volume, blotted dry and rinsed in an etching solution typically comprising 30 parts hydrofluoric acid to 1 part alcohol by volume, as indicated in block II. The lead wire should be positioned to an easy slide fit in a tube to be described in relation to FIG. 2 such that its end is exposed beyond the tube. This is indicated in block III. The semiconductive wafer is then brought to within a fraction of an inch, typically one-quarter inch, of the exposed end of the lead wire to insure proper alignment with the desired portion of the wafer, as indicated in block IV. The exposed end of the lead wire is then heated electrically to above its melting point. As the metal melts, the surface tension of the molten metal causes an approximately spherical portion or ball to form. This is indicated in block V. While the ball is still molten, the air or gas pressure is applied to the tube containing the lead wire, and the wire is ejected at a suitable pressure, of typically about twenty to sixty-five pounds per square inch, at the surface of a semiconductive wafer to provide an alloyed contact. This is indicated in block VI.

Figure 2:
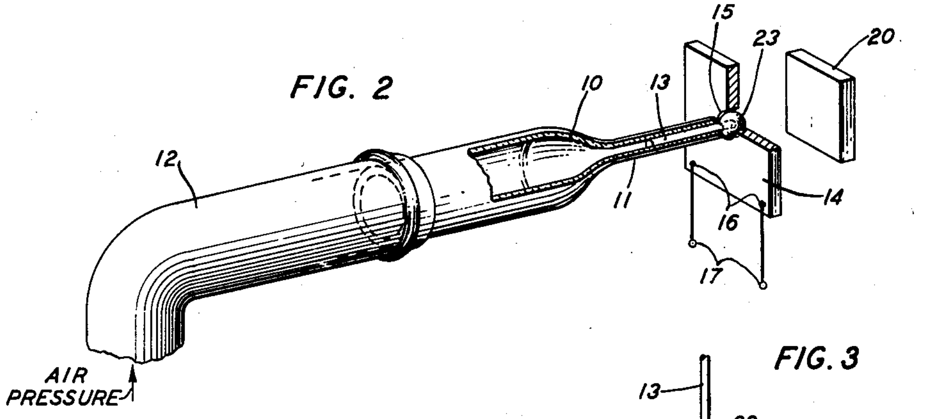
FIG. 2 shows apparatus for the practice of the method of this invention.

In FIG. 2, quartz tube 10 may be seen to have a tubular constricted extension 11. Typically, tube 10 and extension 11 have outside diameters of one-quarter inch and one-eighth inch, respectively. The inside diameter of this extension is of the order of several thousandths of an inch. An air pressure tube 12 is attached to the quartz tube 10. Resistance element 14 is positioned at the free end of extension 11. Opening 15 in resistance element 14 is concentric with extension 11 and of slightly larger diameter than the inside diameter of the extension. Wire lead 13 fits within the tubular extension 11 with the end of the wire lead protruding beyond the free end of the extension 11 into opening 15. An electric current is conducted through leads 17 to terminals 16 and is converted to heat by resistance element 14. This heat melts the end of wire lead 13 and causes ball 23 to form. A holder is provided where there can be positioner the semiconductive wafer 20 to receive ball 23 at the prescribed point of contact.

Figure 3:
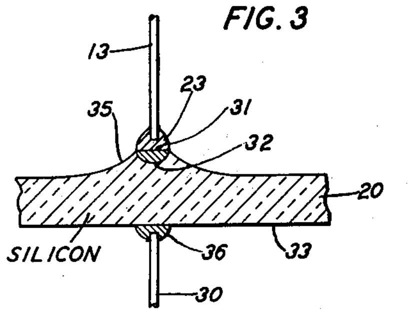
FIG. 3 shows a typical semiconductive device fabricated in accordance with the present invention.

FIG. 3 is a cross-sectional view of a diode fabricated in accordance with the present invention. Semiconductive wafer 20 is P-type silicon crystal about forty-thousandths of an inch square and five-thousandths of inch thick. A gold antimony alloy wire lead 13 is attached to surface 31 of P-type silicon semiconductive wafer 20. The rectifying junction 32 is formed below this contact. A mesa 35 is produced directly below the gold ball 23 and includes the rectfying junction 32. A gold lead 30 is attached to surface 33 of the semiconductive wafer 20 through ball 36. This connection is substantially ohmic.

Figure 4A:
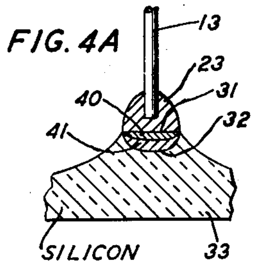
FIGS. 4A and 4B show, in microscopic enlargement, cross sections of contacts made in accordance with the present invention.
Figure 4B:
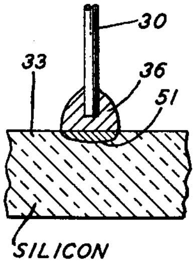

FIGS. 4A and 4B illustrate, in microscopic enlargement, the contacts to the semiconductive wafer shown in FIG. 3. Gold-antimony lead wire 13 melts at approximately 1050 degrees centigrade. Because this wire travels at least one-quarter of an inch in air and because the heat of the ball is dissipated proportionally to the time of flight, the ball at impact is cooler than the ejection temperature, but remains above the melting point of the lead wire 13. The melting point of silicon is 1420 degrees centigrade. However, the gold-silicon eutectic is 370. Therefore, on contact between the molten ball and the silicon, the temperature of the gold-silicon interface is raised briefly to above the eutectic and the interface melts dissolving the contiguous silicon material. Additionally, this point of contact rapidly cools because the semiconductive wafer is initially at room temperature. During this rapid cooling a shallow alloyed region 40 recrystallizes directly below the contact. This region is about one ten thousandths of an inch deep and contains a mixture of P-type silicon and gold. The antimony diffuses beyond this region to convert region 41 to N-type silicon forming P–N junction 32. On the other hand, if a pure gold lead 30, shown in FIG. 4B is used, a low resistance, shallow, alloyed region 51 results because of the rapid decrease in temperature.

Lead wires have been attached to both silicon and germanium wafers in accordance with the present invention. Specifically, gold wires four-thousandths of an inch in diameter and three-eighths of an inch long have been attached to silicon and germanium wafers. The strength of the contacts was sufficient to detach significant amounts of silicon when the contact was pulled loose. The depth of alloying penetration has been measured to be from ten to fifteen hundred-thousandths of an inch deep. Ohmic contact resistance values range from three to thirteen ohms for a contact area with a diameter of twelve to fifteen ten-thousandths of an inch on four-tenths to one ohm cm. silicon wafers.

The accumulation of oxide on the surface of the semiconductive wafer has been found to weaken the mechanical strength of lead attachments to said surface. The accumulation of the oxide may be avoided by carrying out the entire process in a forming gas atmosphere. One such atmosphere comprises 85% nitrogen to 15% hydrogen by volume. While this is a reducing atmosphere, a reducing atmosphere is not necessary. It is only important to avoid an oxidizing atmosphere. Therefore, any inert gas atmosphere or a vacuum is sufficient.

Alternatively, if an oxidizing atmosphere is present, contact to the semiconductive surface may be made before any appreciable oxide accumulation occurs.

No effort has been made to describe all possible embodiments of this invention. It should be understood that the embodiments described are merely illustrative of the preferred form of the invention and various modifications may be made therein without departing from the scope and spirit of this invention.

It is contemplated that further control over the depth of alloying may be exercised by regulating the temperature of the system. For example, there is evidence that a contact to a cold semiconductive wafer will be more shallow than a corresponding contact to a semiconductive wafer at room temperature. Similarly, cooling the compressed air should also reduce the depth of alloying.

What is claimed is:

1. A method for connecting a lead wire to an exposed surface of a semiconductor wafer in the absence of an intermediate electrode comprising, forming on the front end of said lead wire an uncoated molten ball of said lead wire material, and propelling said lead wire, molten ball first, into contact with said exposed surface, the temperature of said molten ball being sufficient at the moment of impact to melt the impacted surface portion.

2. A method for connecting a lead wire to the surface of a semiconductor wafer in the absence of an intermediate electrode comprising, forming on the front end of said lead wire an uncoated molten ball of said lead wire material, and propelling said lead wire, molten ball first, in a gas forming atmosphere into contact with said exposed surface, the temperature of said molten ball being sufficent at the moment of impact to melt the impacted surface portion.

3. A method for connecting a lead wire to an exposed surface of a semiconductor wafer in the absence of an intermediate electrode comprising, melting the front end of said lead wire to form an uncoated molten ball thereon, and propelling said lead wire, molten ball first, into contact with said exposed surface, the temperature of the molten ball being sufficient at the moment of impact to melt the impacted surface portion of the semiconductor wafer whereby on cooling said ball is alloyed into said surface.

References Cited in the file of this patent

UNITED STATES PATENTS

| | | |
|---|---|---|
| 2,381,025 | Addink | Aug. 7, 1945 |
| 2,804,405 | Derick et al. | Aug. 27, 1957 |
| 2,918,719 | Armstrong | Dec. 29, 1959 |
| 2,947,925 | Maynard et al. | Aug. 2, 1960 |

OTHER REFERENCES

RCA Technical Notes Nos. 7, 8 and 23, published by the Radio Corporation of America, RCA Laboratories, Princeton, New Jersey.